United States Patent
Gohda et al.

(10) Patent No.: US 8,912,019 B2
(45) Date of Patent: Dec. 16, 2014

(54) ORGANIC ELECTROLUMINESCENT ELEMENT MANUFACTURING METHOD

(75) Inventors: Tadashi Gohda, Mie (JP); Kimitaka Ohhata, Mie (JP)

(73) Assignee: Sharp Kabushiki Kaisha, Osaka (JP)

( * ) Notice: Subject to any disclaimer, the term of this patent is extended or adjusted under 35 U.S.C. 154(b) by 2067 days.

(21) Appl. No.: 11/913,872

(22) PCT Filed: Apr. 13, 2006

(86) PCT No.: PCT/JP2006/307833
§ 371 (c)(1),
(2), (4) Date: Jan. 14, 2009

(87) PCT Pub. No.: WO2006/123491
PCT Pub. Date: Nov. 23, 2006

(65) Prior Publication Data
US 2009/0253223 A1  Oct. 8, 2009

(30) Foreign Application Priority Data

May 16, 2005  (JP) .................. 2005-142399

(51) Int. Cl.
*H01L 21/00* (2006.01)
*H01L 51/00* (2006.01)
*H01L 27/32* (2006.01)
*H01L 51/50* (2006.01)
*H01L 51/56* (2006.01)

(52) U.S. Cl.
CPC ......... *H01L 51/0004* (2013.01); *H01L 27/3246* (2013.01); *H01L 51/0012* (2013.01); *H01L 51/5048* (2013.01); *H01L 51/5088* (2013.01); *H01L 51/56* (2013.01)

USPC .................... 438/29; 438/30; 257/40

(58) Field of Classification Search
CPC ........... H01L 27/3246; H01L 51/0004; H01L 51/0005; H05B 33/10
USPC ............ 438/29, 30, 70, 780; 257/40, 59, 88, 257/E21.09, E31.095
See application file for complete search history.

(56) References Cited

U.S. PATENT DOCUMENTS

| | | | |
|---|---|---|---|
| 6,852,994 B2 * | 2/2005 | Seki et al. | 257/40 |
| 7,015,503 B2 | 3/2006 | Seki et al. | |
| 7,112,823 B2 * | 9/2006 | Ishii et al. | 257/80 |
| 7,204,573 B2 | 4/2007 | Koyama | |
| 7,214,959 B2 | 5/2007 | Seki et al. | |
| 7,273,801 B2 | 9/2007 | Seki et al. | |

(Continued)

FOREIGN PATENT DOCUMENTS

| | | |
|---|---|---|
| JP | 2002-131529 A | 5/2002 |
| JP | 2003-187970 A | 7/2003 |
| JP | 2004-031077 A | 1/2004 |
| JP | 2004-171943 A | 6/2004 |

OTHER PUBLICATIONS

Official communication issued in the International Application No. PCT/JP2006/307833, mailed on May 16, 2006.

*Primary Examiner* — Khiem D Nguyen
(74) *Attorney, Agent, or Firm* — Keating & Bennett, LLP

(57) ABSTRACT

An ink containing an electroluminescent light emitting material is discharged onto a buffer layer. The discharge amount of the ink is larger than a maximum volume where the ink is retained by the surface tension thereof on the top surface of the buffer layer.

3 Claims, 2 Drawing Sheets

(56) References Cited

U.S. PATENT DOCUMENTS

| | | |
|---|---|---|
| 7,332,369 B2 * | 2/2008 | Veres et al. ............ 438/99 |
| 2004/0058087 A1 * | 3/2004 | Baudin et al. ............ 427/487 |
| 2004/0201048 A1 * | 10/2004 | Seki et al. ............ 257/294 |
| 2005/0118328 A1 | 6/2005 | Seki et al. |
| 2005/0170076 A1 | 8/2005 | Seki et al. |
| 2005/0170550 A1 | 8/2005 | Seki et al. |
| 2005/0186403 A1 | 8/2005 | Seki et al. |

* cited by examiner

ORGANIC ELECTROLUMINESCENT ELEMENT MANUFACTURING METHOD

BACKGROUND OF THE INVENTION

1. Field of the Invention

The present invention relates to an organic electroluminescent element manufacturing method.

2. Description of the Related Art

Recently, an organic electroluminescent element (hereinafter it is referred to as an organic EL element) has been receiving attention as a flat display element in the next generation display apparatuses.

In general, the organic EL element includes: a first electrode; a buffer layer (a hole transport layer, a hole injection layer, or the like) provided on the first electrode; a light emitting layer provided on the buffer layer; and a second electrode provided on the light emitting layer. While the light emitting layer has comparatively low conductivity, the buffer layer has comparatively high conductivity in general. For this reason, when the buffer layer is in direct contact with the second electrode, the second electrode becomes conducting to the first electrode to generate leakage current, thereby lowering the light emitting efficiency. In view of this, the light emitting layer must be formed so as to cover the buffer layer completely. Nevertheless, in the case where the buffer layer and the light emitting layer are formed by ink-jetting, a part of the buffer layer may be exposed from the light emitting layer according to the discharge amount of an ink, which means that the buffer layer may be covered with the light emitting layer only partially or not completely.

To tackle the above problem, for example, in WO 01/074121, a film formation region of the light emitting layer is made larger than the a film formation region of the hole transport layer by setting the amount of the light emitting layer forming ink to be larger than that of the hole transport layer forming ink.

Even in the case where the amount of the light emitting layer forming ink is set larger than that of the hole transport layer forming ink (an ink for forming the buffer layer), however, the film formation region of the light emitting layer becomes not necessarily larger than the film formation region of the buffer layer, and therefore, the buffer layer may be covered with the light emitting layer partially or not completely. Accordingly, in order to attain a condition where the buffer layer is covered with the light emitting layer completely, a test must be repeated in which organic EL elements are manufactured actually with the discharge amounts of the inks changed and leakage current is measured. This increases the manufacturing cost of the organic EL element.

SUMMARY OF THE INVENTION

In order to overcome the problems described above, preferred embodiments of the present invention provide a method for manufacturing easily at low cost an organic EL element in which leakage current is suppressed.

In order to overcome the problems described above, the inventors set the discharge amount of a light emitting layer forming ink larger than a maximum volume where the ink is retained by the surface tension thereof on the top surface of a buffer layer.

More specifically, according to a preferred embodiment of the present invention, a method for manufacturing an organic electroluminescent element including a first electrode, a buffer layer provided on the first electrode, a light emitting layer provided on the buffer layer and containing an electroluminescent light emitting material, and a second electrode provided on the light emitting layer, includes the steps of discharging onto the buffer layer an ink containing the electroluminescent light emitting material, a volume of the ink being larger than a maximum volume where the ink is retained by surface tension thereof on a top surface of the buffer layer; and obtaining the light emitting layer by drying the ink discharged on the buffer layer.

With the above steps and arrangement, the ink discharged on the buffer layer inevitably floods and spreads over the buffer layer so as to cover the buffer layer. Accordingly, the buffer layer is definitely covered with the light emitting layer to suppress generation of leakage current.

The maximum volume where the ink is retained by the surface tension thereof on the top surface of the buffer layer can be calculated from the surface area of the buffer layer and the surface tension of the ink with respect to the buffer layer. Accordingly, a suitable condition for manufacturing an organic EL element can be attained without actually manufacturing the organic EL element. Further, even in the case where the specification, such as a dimension of the form or the like of the organic EL element is changed, only such calculation can attain the suitable manufacturing condition without performing experiments in so far as the compositions of the buffer layer forming ink and a light emitting layer forming ink are not changed. This achieves reductions in cost and time required for experimental manufacture prior to actual manufacture, leading to manufacture of an organic EL at low cost.

Prior to the discharging step, a calculating step of obtaining the maximum volume may be performed.

The discharging step may be performed by discharging the ink onto the buffer layer plural times.

The buffer layer may be composed of a hole injection layer and/or a hole transport layer.

It has been tried to increase the surface tension of the light emitting layer forming ink with respect to a bank in view of attainment of a light emitting layer having uniform layer thickness. On the other hand, no attention has been focused on the surface tension of the light emitting layer forming ink with respect to the buffer layer. The inventors have focused their study on examining the surface tension of the light emitting layer forming ink with respect to the buffer layer to achieve for the first time a method in which the buffer layer can be covered with the light emitting layer easily.

These and other features, elements, steps, advantages, and characteristics of the present invention will be apparent from the following description of preferred embodiments with reference to the accompanying drawings.

DETAILED DESCRIPTION OF PREFERRED EMBODIMENTS

Preferred embodiments of the present invention will be described below with reference to the accompanying drawings.

First Preferred Embodiment

Figure 1:
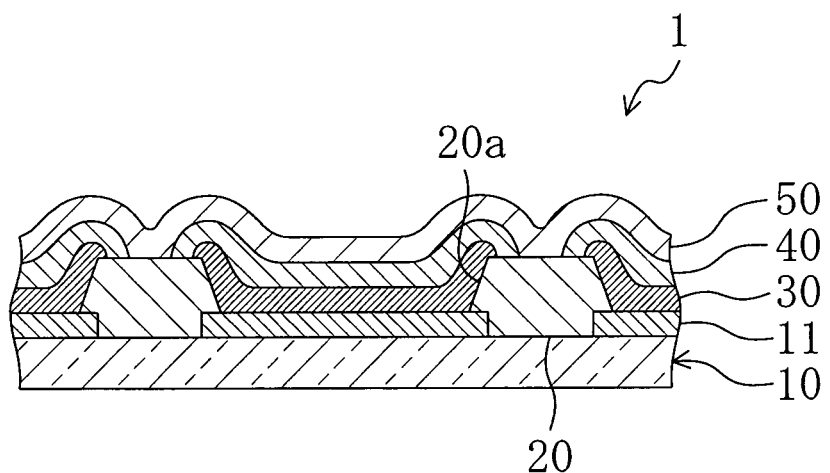
FIG. 1 is a sectional view of a portion of an organic EL element in accordance with a preferred embodiment of the present invention.

FIG. 1 is a sectional view of a portion of an organic EL element 1 in accordance with the first preferred embodiment.

First, a structure of the organic EL element 1 manufactured according to the first preferred embodiment will be described with reference to FIG. 1. The organic EL element 1 preferably includes an active matrix substrate 10 having a surface on which a plurality of first electrodes (anodes) 11 are arranged in matrix, a bank (diaphragm) 20; a buffer layer 30, a light emitting layer 40, and a second electrode 50 (cathode). The bank 20 is formed on the active matrix substrate 10. In the bank 20, a plurality of openings 20a preferably having a circular or substantially circular shape in a plan view are formed through which the plurality of first electrodes 11 formed on the active matrix substrate 10 are exposed. In the first preferred embodiment, the bank 20 preferably has a substantially trapezoidal shape in transverse section. The "substantially trapezoidal shape" means a trapezoidal shape of which any corner is obtuse. The obtuse corner may be a corner (or corners) of which angle exceeds 90 degrees or may be curved. The corner may be curved and obtuse.

The buffer layer 30 is formed on the first electrodes 11 in the openings 20a. On the buffer layer 30, the light emitting layer 40 is formed. Specifically, layered structures of the plurality of first electrode 11, the buffer layer 30, and the light emitting layer 40 are defined and insulated from each other by the bank 20. The buffer layer 30 may be composed of a hole injection layer and/or a hole transport layer. Provision of a hole injection layer containing a hole transporting material, such as poly(3,4-ethylenedioxythiophene)/poly(styrenesulfonate) (PEDT/PSS) or the like increases the hole injection efficiency where holes are injected from the first electrodes 11 to the light emitting layer 40. Provision of a hole transport layer increases the hole transporting efficiency where holes are transported from the first electrodes 11 to the light emitting layer 40.

The second electrode 50 is provided on the light emitting layer 40. Specifically, the second electrode 50 is formed in a plane form so as to cover the whole surfaces of the light emitting layer 40 and the bank 20. In the first preferred embodiment, the second electrode 50 is preferably formed directly on the light emitting layer 40, but a buffer layer may be formed on the light emitting layer 40 so that the second electrode 50 is formed on the buffer layer. In this case, the buffer layer formed between the light emitting layer 40 and the second electrode 50 may be composed of an electron injection layer and/or an electron transport layer. Provision of such a buffer layer increases the electron injection efficiency and/or the electron transporting efficiency where electrons are injected and transported to the light emitting layer 40. Though the first preferred embodiment describes the case where the first electrodes 11 are anodes while the second electrode 50 is a cathode, the first electrodes 11 may be cathodes when the second electrode 50 is an anode. In this case, the buffer layer 30 between the first electrodes 11 and the light emitting layer 40 may be composed of an electron transport layer and/or an electron injection layer.

Preferably, the buffer layer 30 is formed so as to cover a portion (a portion of an inclined surface, for example) of the surface of the bank 20. Further preferably, it is formed so as to cover the inclined surface of the bank 20 and so as to be mounted on the top surface thereof. In other words, it is preferable that the area of the buffer layer 30 formed over each opening 20a is larger in plan view than the area of a portion of each first electrode 11 which is exposed through the associated opening 20a of the bank 20 so that each first electrode 11 exposed through the associated opening 20a is covered with the buffer layer 30 completely. Further, it is preferable that the light emitting layer 40 is formed so as to cover the buffer layer 30 completely. With this arrangement, the light emitting layer 40 having comparatively low conductivity can definitely and reliably intervene between the first electrodes 11 and the second electrode 50. This suppresses generation of leakage current between the first electrodes 11 and the second electrode 50. As a result, the organic EL element 1 has high light emitting efficiency.

With the above arrangement, the area rate that the bank 20 and the light emitting layer 40 occupy in a plan view increases relatively to attain a high aperture ratio. In this view point, the buffer layer is preferably formed so as to cover 40% or larger area (50% or larger area is preferable, and 60% or larger area is more preferable) of the surface of the bank 20. However, it is preferable that the buffer layer 30 does not cover the central part in the transverse direction of the bank 20 for preventing adjacent parts of the buffer layer 30 from being in contact with each other, thereby preventing generation of leakage current between the adjacent parts thereof. In other words, the buffer layer 30 is preferably formed so as to cover 90% or smaller area (80% or smaller area is preferable, and 70% or smaller area is more preferable) of the surface of the bank 20.

A method for manufacturing the organic EL element 1 will be described next with reference to FIG. 1 and FIG. 2.

Figure 2:
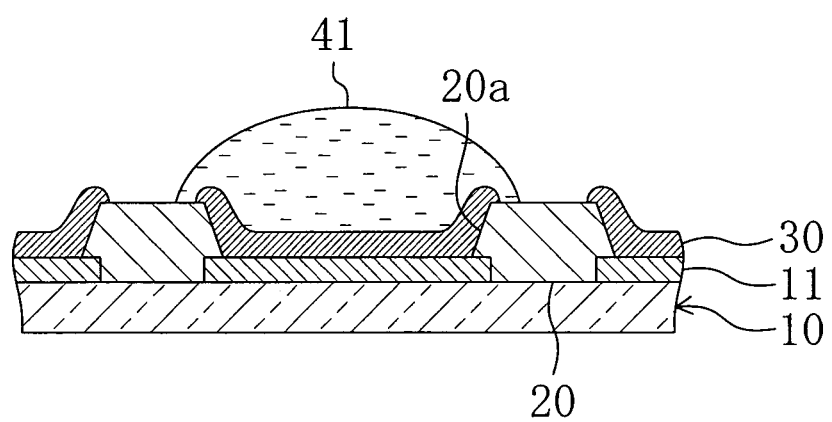
FIG. 2 is a sectional view showing a step of discharging a light emitting layer forming ink.

FIG. 2 is a sectional view showing a step of discharging a light emitting layer forming ink 41.

First, the active matrix substrate 10 having a surface on which the plurality of first electrodes 11 are formed is prepared. Then, the bank 20 is formed on the prepared active matrix substrates 10. The bank 20 may be made of, for example, photosensitive novolac based resin or acrylic resin. Specifically, for example, a film made of photosensitive novolac based resin or the like is formed on the active matrix substrate 10 by spin coating or the like and is patterned by photolithography or the like, thereby obtaining the bank 20 in which the plurality of openings 20a are formed.

Next, the buffer layer 30 is formed by a wet process, such as ink-jetting. In the process of forming the buffer layer 30, it is preferable that the surface of each first electrode 11 has a lyophilic property (property of soaking a discharged ink in the following process) while the surface of the bank 20 has a repellent property (property of rejecting a discharge ink in the following process). This increases affinity and adhesiveness between the first electrodes 11 and the buffer layer 30 and suppresses flooding of the ink discharged into each opening 20a over the bank 20. Accordingly, it is preferable to allow the surface of each first electrode 11 to be lyophilic and to allow the surface of the bank 20 to be repellent prior to formation of the buffer layer 30. For allowing the surface of each first electrode 11 to be lyophilic and allowing the surface of the bank 20 to be repellent, the first electrodes 11 and the bank 20 are subjected to, for example, a plasma treatment using an oxygen gas and a fluorocarbon gas after formation of the bank 20.

The buffer layer 30 is formed, specifically, in such a manner that a buffer layer forming ink containing a material for forming the buffer layer 30 (for example, a material for hole injection, a material for hole transportation, or the like) is dropped (discharged) once or a plurality of times onto the first electrodes 11 exposed through the openings 20a and is then dried.

Subsequently, the light emitting layer 40 is formed on the thus-formed buffer layer 30 by a wet process, such as ink-jetting or the like. Specifically, a light emitting layer forming ink 41 containing an electroluminescent light emitting material is dropped (discharged) once or a plurality of times onto the buffer layer 30. The volume of the discharged light emitting layer forming ink 41 is set larger than a previously calculated maximum volume where the light emitting layer forming ink 41 is retained by the surface tension thereof on the top surface of the buffer layer 30 (hereinafter it may be referred to as merely "maximum volume"). Then, it is dried to thus form the light emitting layer 40. Finally, the second electrode 50 is formed by vapor deposition or the like, thereby completing the organic EL element 1.

In the case where, for example, the volume of the light emitting layer forming ink 41 discharged onto the buffer layer 30 is smaller than the maximum volume, the discharged light emitting layer forming ink 41 is retained on the buffer layer 30. This causes the light emitting layer forming ink 41 not to cover an end portion of the buffer layer 30, thereby exposing a portion of the buffer layer 30 from the light emitting layer 40 to invite formation of a portion where the light emitting layer 40 having comparatively low conductivity does not intervene between the first electrodes 11 and the second electrode 50. This invites generation of leakage current between the first electrodes 11 and the second electrode 50.

In contrast, in the first preferred embodiment, the light emitting layer forming ink 41 of which volume is larger than the maximum volume is discharged onto the buffer layer 30, as described above, thereby flooding over the buffer layer 30. Accordingly, as shown in FIG. 2, the buffer layer 30 is definitely and reliably covered with the light emitting layer 40. As a result, the light emitting layer 40 necessarily intervenes between the first electrodes 11 and the second electrode 50, thereby definitely suppressing generation of leakage current between the first electrodes 11 and the second electrode 50. In other words, the manufacturing method in accordance with the first preferred embodiment attains the organic EL element 1 in which generation of leakage current is suppressed.

The maximum volume can be calculated from only the surface area of the buffer layer 30 and the surface tension (contact angle) of the light emitting layer forming ink 41 with respect to the buffer layer 30. Accordingly, a suitable manufacturing condition can be attained without actually manufacturing the organic EL element 1. This reduces cost and time required for experimental manufacture prior to actual manufacture.

Moreover, even in the case where the specification, such as a dimension of the form or the like is changed, a suitable manufacturing condition can be attained only by calculation without conducting experiments in so far as the compositions of the buffer layer forming ink and the light emitting layer forming ink 41 are not changed.

Specifically, the maximum volume can be calculated by the following manner, for example. First, the same layer as the buffer layer 30 is formed on a glass substrate, and the light emitting layer forming ink 41 is discharged onto the layer. Then, the contact angle between the discharged light emitting layer forming ink 41 and the buffer layer 30 is measured. The maximum volume can be calculated from the contact angle. For example, in the case where a portion of each first electrode 11 which is exposed from the bank 20 in a plan view is circular or substantially circular, as in the first preferred embodiment, the maximum volume Vmax can be obtained from Equation 1 supposing that the radius of the portion of each first electrode 11 which is exposed from the bank 20 is r and the contact angle is θ.

Equation 1

$$V_{max} = \frac{\pi r^3}{3\sin^3\theta}(1 - \cos\theta)^2(2 + \cos\theta) \qquad (1)$$

In general, the surface tension of the light emitting layer forming ink 41 with respect to the bank 20 is smaller than the surface tension of the buffer layer forming ink with respect to the bank 20. In other words, the light emitting layer forming ink 41 wets the bank 20 more than the buffer layer forming ink. Accordingly, it is preferable to set the volume of the light emitting layer forming ink discharged onto the buffer layer 30 smaller than the volume of the buffer layer forming ink discharged onto each first electrode 11. Even when the volume of the discharged light emitting layer forming ink 41 is smaller than the volume of the buffer layer forming ink, the buffer layer 30 is covered with the light emitting layer 40 even more reliably and definitely. When the volume of the discharged light emitting layer forming ink 41 is set to be comparatively small, flooding of the light emitting layer forming ink 41 over the bank 41 is suppressed.

The present invention is applicable not only to the manufacture of an organic EL element by ink-jetting but also to the manufacture of an organic EL element by any of various wet processes, such as spin coating, doctor blade, discharge coating, spray coating, relief printing, intaglio printing, screen printing, micro grabbier coating, and the like in general.

Modified Example

Figure 3:
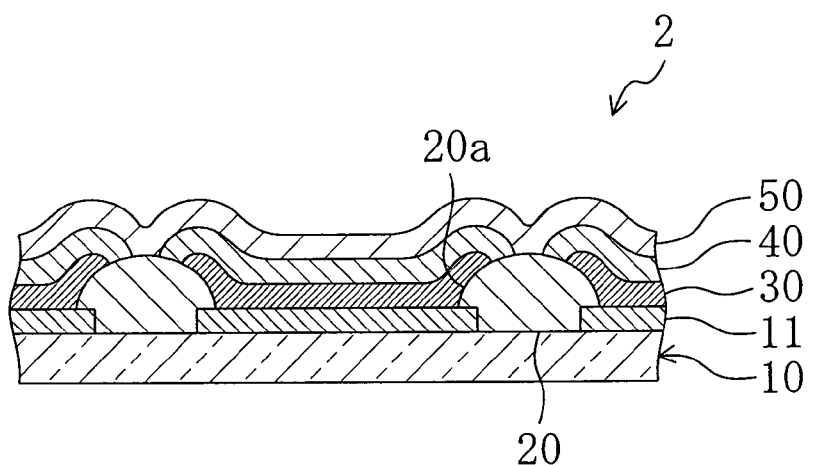
FIG. 3 is a sectional view of a portion of an organic EL element in accordance with a modified example of a preferred embodiment of the present invention.

FIG. 3 is a sectional view of a part of an organic EL element 2 in accordance with modified example of a preferred embodiment of the present invention.

Figure 4:
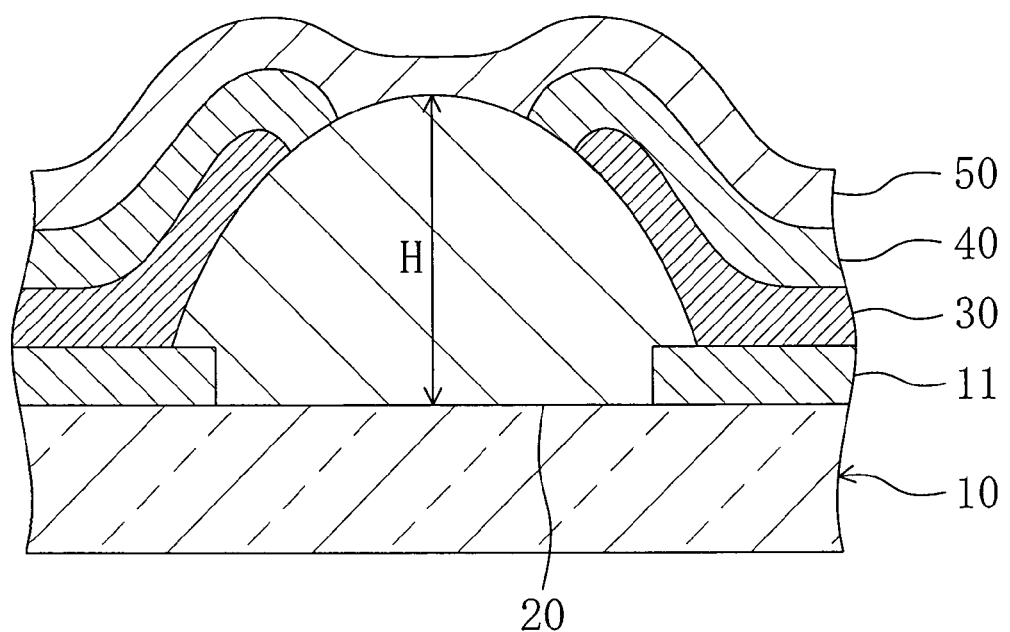
FIG. 4 is an enlarged sectional view of the vicinity of a bank of an organic EL element in accordance with a preferred embodiment of the present invention.

FIG. 4 is an enlarged sectional view of the vicinity of a bank 20 of the organic EL element 2.

Though the first preferred embodiment refers to manufacture of the organic EL element 1 in which the bank 20 preferably having a substantially trapezoidal shape in transverse section is formed, the shape of the bank 20 is not limited in the present invention. For example, as in the present modified example, the bank 20 may have a dome-like shape in transverse section (to have a curved surface).

In the case where the bank 20 has a dome-like shape in transverse section as in the present modified example, the buffer layer 30 preferably covers a lower part of the bank 20 of which height is H/2 or larger (preferably, 3H/5 or larger, and more preferably, 7H/10 or larger) where H is the height from the active matrix substrate 10 to the top of the bank 20. This increases the aperture rate of the organic EL element 2.

Example 1

The same organic EL element as in the first preferred embodiment was manufactured for Example 1.

First, an active matrix substrate 10 having a surface on which first electrodes 11 made of indium tin oxide (ITO) are arranged in matrix was prepared. An acryl resin film was formed by spin coating a photosensitive acryl resin onto the active matrix substrate 10. The thus formed acryl resin film was patterned by photolithography to form a bank 20. Openings 20a formed in the bank 20 were substantially circular having a radius of about 200 µm.

Next, the thus formed bank 20 and the first electrodes 11 were subjected to a plasma treatment using an oxygen gas and a fluorocarbon gas to provide a repellent property to the surface of the bank 20 and to provide a lyophilic property to the surface of each first electrode 11.

Subsequently, an ink for forming a hole transport layer (a hole transport layer forming ink) is prepared by using an aqueous dispersion of poly(3,4-ethylenedioxythiophene)/poly(styrenesulfonate) (PEDT/PSS), a product by Bayer Co. (Bytron P). The compositions of the thus prepared hole transport layer forming ink are indicated in Table 1 below.

TABLE 1

|  | wt % |
|---|---|
| Bytron P | 7 |
| water | 50 |
| methanol | 5 |
| isopropyl alcohol | 6 |
| 1.3-dimethyl-2-imidazolidinone | 30 |

When the surface tension of the thus obtained hole transport layer forming ink was measured by CBVP-Z, a product by KYOWA INTERFACE SCIENCE CO., LTD., it was 44 mN/m.

Thereafter, 50 drops (2000 pl in total) of the thus obtained hole transport layer forming ink was discharged into each opening 20a by an inkjet head capable of discharging an ink droplet at 40 pl (pico-litter)/drop. After the discharge, baking by a hotplate was performed for 30 minutes at 200° C. to form a buffer layer (a hole transport layer) 30. The thus-obtained buffer layer 30 has a substantially circular shape in plan view having a radius of approximately 205 µm.

Next, a polyfluorene based molecular derivative as a luminescent material was dissolved in 1,3,5-trimethylbenzene to prepare a light emitting layer forming ink 41. The concentration of the light emitting layer forming ink 41 was set at about 10 mg/ml. When the surface tension of the thus obtained light emitting layer forming ink 41 was measured by CBVP-Z, a product by KYOWA INTERFACE SCIENCE CO., LTD., it was about 29 mN/m.

Subsequently, there was obtained the maximum volume (Vmax) of the light emitting layer forming ink 41 at which it is retained by the surface tension thereof on the top surface of the buffer layer 30. Specifically, the maximum volume (Vmax) was obtained by the following manner. First, the hole transport layer forming ink used for forming the hole transport layer 30 was spin coated onto a glass substrate and was baked for about 30 minutes at approximately 200° C. to prepare a sample substrate for evaluation. The light emitting layer forming ink 41 of about 1 µl in volume was discharged onto the sample substrate, and the contact angle was measured by CA-W, a product by KYOWA INTERFACE SCIENCE CO., LTD. In Example 1, the contact angle (θ) of the light emitting layer forming ink 41 with respect to the hole transport layer 30 was about 11°. From this result, the maximum volume (Vmax) was calculated with the use of Equation 1. The calculated result of the maximum volume (Vmax) was about 1307 pl.

The light emitting layer forming ink 41 of about 1320 pl (33 drops) in volume, which is larger than the calculated maximum volume, about 1307 pl, was discharged onto the active matrix substrate 10 on which the hole transport layer 30 is formed, specifically, into the openings 20a by an inkjet head capable of discharging ink droplets at about 40 pl (pico-litter)/drop. Then, baking for about 30 minutes at approximately 200° C. was performed to obtain a light emitting layer 40.

Observation by a microscope found that the thus obtained light emitting layer 40 had a substantially circular shape in a plan view of which diameter was approximately 207 µm, which is larger than the diameter (about 205 µm) in a plan view of the buffer layer 30. The hole transport layer 30 was covered with the light emitting layer 40, and there was no portion of the hole transport layer 30 observed which is exposed at the surface. In addition, there was no portion observed where the light emitting layer forming ink 41 flooded over the bank 20.

Finally, a calcium thin film having a thickness of about 20 nm was formed by vapor deposition and an aluminum thin film having a thickness of about 200 nm was formed thereon by sputtering to form a second electrode 20 formed of a layered film of the calcium thin film and the aluminum thin film, thereby completing the organic EL element in accordance with Example 1.

Example 2

An organic EL element in accordance with Example 2 was manufactured under the same condition as that in Example 1 except the discharge amount of the light emitting layer forming ink 41 per one opening 20a.

In Example 2, the discharge amount of the light emitting layer forming ink 41 per one opening 20a was set at about 2000 pl, which is much larger than the discharge amount (about 1320 pl) of the light emitting layer forming ink 41 in Example 1. As a result, observation of the thus obtained light emitting layer 40 by a microscope found that the hole transport layer 30 was covered with the light emitting layer 40 and there was no portion of the hole transport layer 30 observed which is exposed at the surface. A portion where the light emitting layer forming ink 41 flooded over the bank 20 was observed.

Comparative Example

An organic EL element in accordance with Comparative Example was manufactured under the same condition as that in Example 1 except the discharge amount of the light emitting layer forming ink 41 per one opening 20a.

In Comparative Example, the discharge amount of the light emitting layer forming ink 41 per one opening 20a was set at about 1000 pl, which is smaller than the calculated maximum volume (about 1307 pl). Observation of the thus obtained light emitting layer 40 by a microscope revealed that a portion of the hole transport layer 30 was not covered with the light emitting layer 40 (a portion of the hole transport layer 30 was exposed at the surface). There was no portion observed where the light emitting layer forming ink 41 flooded over the bank 20.

The results of Examples 1 and 2 and Comparative Example are summarized in Table 2 below.

TABLE 2

|  | Example 1 | Example 2 | Comparative Example |
|---|---|---|---|
| Hole transport layer forming ink (pl) | 2000 | 2000 | 2000 |
| Light emitting layer forming ink (pl) | 1320 | 2000 | 1000 |
| Coverage | good | good | poor |
| Ink flooding | no | yes | no |

As can be understood from Table 2, calculation of the maximum volume from the contact angle leads to attainment of a suitable manufacturing condition for enabling the light emitting layer 40 to cover the hole transport layer 30 completely. The suitable manufacturing condition can be attained more easily by measurement of the contact angle of the light emitting layer forming ink 41 with respect to the hole transport layer 30 than by actual experimental manufacture of an organic EL element. Thus, the suitable manufacturing condition could be attained easily and speedily.

From the results of Example 1 and Example 2, it was found that flooding of the light emitting layer forming ink 41 can be suppressed effectively by setting the volume of the light emitting layer forming ink 41 to be smaller than the volume of the hole transport layer forming ink.

Up to this point, examples of the preferred embodiments of the present invention have been described. It is understandable that the disclosed invention will be modified in various manners and will be developed to provide various embodiments other than the above described examples. Hence, the attached claims cover all embodiments belonging to the true spirit and the scope of the present invention.

The present invention attains low-cost manufacture of an organic EL element in which leakage current is suppressed and is, therefore, useful for manufacture of organic EL elements used in mobile phones, PDAs, television sets, electronic books, monitors, electronic posters, clocks, electronic inventory tags, emergency signs, and the like.

While preferred embodiments of the present invention have been described above, it is to be understood that variations and modifications will be apparent to those skilled in the art without departing the scope and spirit of the present invention. The scope of the present invention, therefore, is to be determined solely by the following claims.

The invention claimed is:

1. A method for manufacturing an organic electroluminescent element including a first electrode, a buffer layer provided on the first electrode, a light emitting layer provided on the buffer layer and containing an electroluminescent light emitting material, and a second electrode provided on the light emitting layer, the method comprising the steps of:

calculating a maximum volume where an ink is retained by surface tension thereof on a top surface of the buffer layer based on a surface of the buffer layer and a contact angle of the ink with the buffer layer, the ink being retained by surface tension on the top surface of the buffer layer;

discharging onto the buffer layer an ink containing the electroluminescent light emitting material, a volume of the ink being larger than the maximum volume obtained in the calculating step; and obtaining the light emitting layer by drying the ink discharged on the buffer layer.

2. The method of claim 1, wherein the discharging step is performed by discharging the ink onto the buffer layer plural times.

3. The method of claim 1, wherein the buffer layer is composed of a hole injection layer and/or a hole transport layer.

* * * * *